United States Patent [19]

Mijuskovic

[11] Patent Number: 5,128,630
[45] Date of Patent: Jul. 7, 1992

[54] HIGH SPEED FULLY DIFFERENTIAL OPERATIONAL AMPLIFIER

[75] Inventor: Dejan Mijuskovic, Chandler, Ariz.

[73] Assignee: Motorola, Inc., Schaumburg, Ill.

[21] Appl. No.: 695,482

[22] Filed: May 3, 1991

[51] Int. Cl.$^5$ .............................................. H03F 3/45
[52] U.S. Cl. ..................................... 330/253; 330/258
[58] Field of Search ............... 330/253, 255, 257, 258, 330/277, 307, 9

[56] References Cited

U.S. PATENT DOCUMENTS 4,059,809  11/1977  Sichart ................................. 330/253
4,794,349  12/1988  Senderowicz et al. ......... 330/258 X
5,032,797   7/1991  Mijuskovic ......................... 330/253

Primary Examiner—Steven Mottola
Attorney, Agent, or Firm—Robert D. Atkins

[57] ABSTRACT

An operational amplifier operates with a higher bandwidth by doubling the gate drive to an output stage transistor without increasing the gain of an intermediate stage amplifier. The increased gate drive allows the output stage transistor to be reduced in size while providing the same output drive level to the capacitive load. The smaller output stage transistors reduces its gate capacitance for providing stable operation with the increased bandwidth.

16 Claims, 3 Drawing Sheets

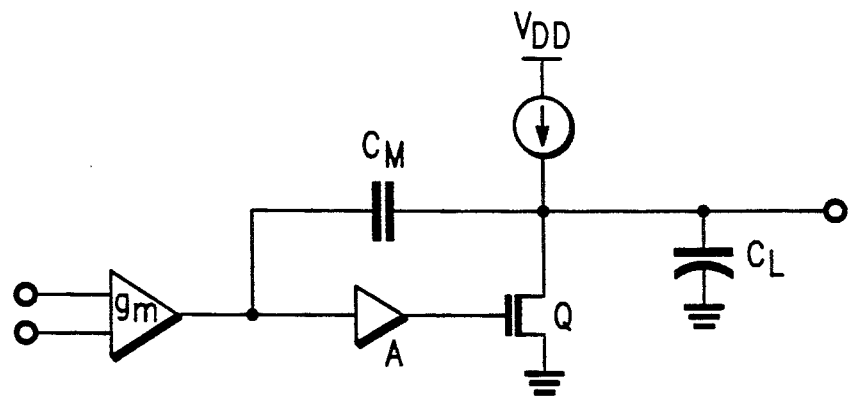
FIG. 1
—PRIOR ART—
FIG. 2
—PRIOR ART—
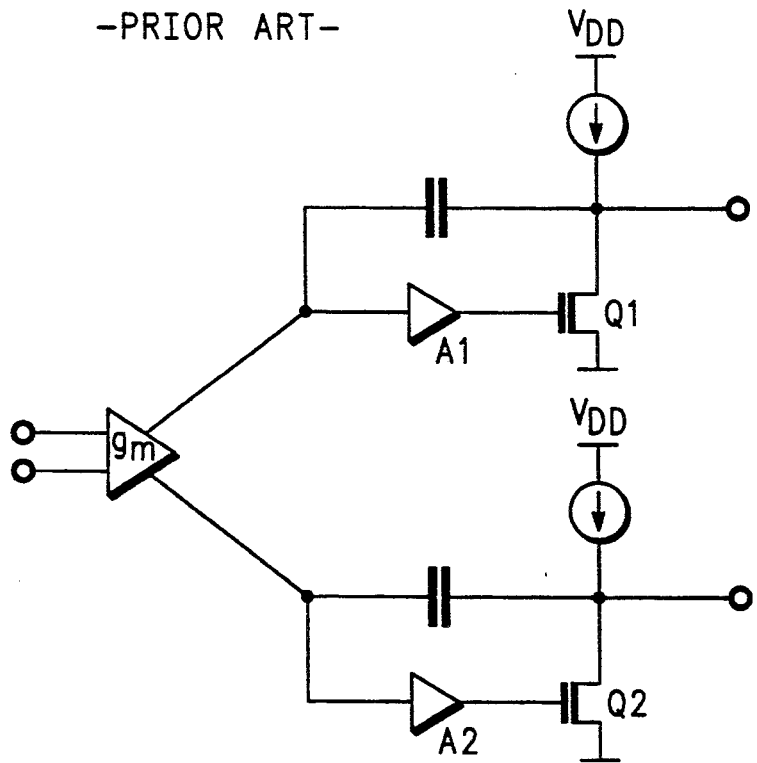

HIGH SPEED FULLY DIFFERENTIAL OPERATIONAL AMPLIFIER

FIELD OF THE INVENTION

This invention relates in general to operational amplifiers and, more particularly, to a fully differential operational amplifier having increased operating speed.

BACKGROUND OF THE INVENTION

A conventional CMOS operational amplifier (op amp) may comprise a transconductance stage and an output driver stage. In a first order approximation, such an op amp is a two-pole system; one dominant pole from a Miller capacitor $C_M$ at the output Of the differential transconductance stage $g_M$ and a second non-dominant pole associated with the output capacitive load $C_L$ at the drain of transistor Q as shown in FIG. 1. The dominant pole stabilizes the op amp by decreasing the loop gain below unity, ideally before the non-dominant pole becomes effective, thereby avoiding oscillations. Since the transconductance stage $g_M$ typically has high gain and a high output impedance, the Miller capacitor $C_M$ is made small in high frequency applications to increase the open loop bandwidth of the op amp, while the output stage transistor Q is made large to drive the external capacitive load $C_L$.

To increase the bandwidth and operating speed of the conventional op amp, the second non-dominant pole ($1/R_QC_L$) can be moved to a higher frequency which is usually done by increasing the transconductance of the output device, or by inserting gain (like amplifier A) between the transconductance stage $g_M$ and the output stage transistor Q. The insertion of amplifier A creates a minor loop in the op amp, through output stage transistor Q, Miller capacitor $C_M$ and amplifier A, with a dominant pole from capacitor $C_L$ and the output impedance of transistor Q ($1/R_QC_L$), and a non dominant pole associated with amplifier A and the gate capacitance of transistor Q ($1/R_AC_Q$). In order to keep the minor loop stable, the frequency of the non-dominant pole has to be much higher than the unity gain frequency of the minor loop $\omega_u = g_{MQ} \times A/C_L$, say by a factor of four. Unfortunately, the introduction of amplifier A moves the unity gain frequency $\omega_u$ closer to the non-dominant pole frequency of the minor loop and increases its output impedance which moves the same non-dominant pole closer to the unity gain frequency $\omega_u$. The combination contributes to instability of the minor loop at higher operating frequencies thereby limiting the bandwidth of the op amp. Thus, there is a trade-off between (a) using amplifier A to increase the non-dominant pole and unity gain frequency of the entire op amp for more bandwidth, and (b) de-stabilizing the minor loop with to much gain via amplifier A.

A fully differential version of the aforedescribed op amp is shown in FIG. 2 with amplifiers A1 and A2 driving separate output stage transistors Q1 and Q2. The compromise between bandwidth of the op amp and the stability of the minor loop also applies to the fully differential prior art, wherein the amplifiers A1 and A2 increase the non-dominant poles of the op amp for a more bandwidth although at the expense of introducing instability in the minor loops.

Hence, what is needed is an improved operational amplifier having gain inserted before the output stage transistor for more bandwidth without causing stability problems.

SUMMARY OF THE INVENTION

Briefly stated, the invention comprises an amplifier circuit responsive to a differential input signal for providing first and second differentially related output signals. The amplifier circuit comprises a differential amplifier responsive to the differential input signal for providing a differential output signal with common rejection having inverted and non-inverted components. A first amplifier has a non-inverting input coupled for receiving the non-inverted component of the differential output signal and an inverting input coupled for receiving the inverted component of the differential output signal, and a second amplifier has a non-inverting input coupled for receiving the inverted component of the differential output signal and an inverting input coupled for receiving the non-inverted component of the differential output signal. The outputs of the first and second amplifiers provide the first and second differentially related output signals of the amplifier circuit.

In another aspect the present invention is an amplifier circuit with a transconductance stage providing first and second differentially related signals having a predetermined DC offset to an output driver stage for providing a first output signal. The output driver stage comprises a first transistor having a gate coupled for receiving the first differentially related signal and a drain coupled to a first source of operating potential, while a second transistor has a gate coupled for receiving the second differentially related signal, a drain coupled to the source of the first transistor and a source coupled to a second source of operating potential. A third transistor includes a gate coupled to the drain of the second transistor, a source coupled to the second source of operating potential while a drain provides the first output signal of the amplifier circuit.

In yet another aspect the present invention is an amplifier circuit with a transconductance stage responsive to a differential input signal for providing first and second non-inverted components of a differential output signal and first and second inverted components of the differential output signal to an output stage. The transconductance stage comprises a current mirror circuit having an input and first and second outputs, and a current supply having first and second outputs for providing first and second currents of predetermined magnitude. The differential input signal is applied at the first and second outputs of the current mirror circuit. A first transistor includes a gate coupled to the first output of the current supply, a drain coupled to a first source of operating potential and a source coupled to the input of the current mirror circuit. A second transistor has a gate coupled to the second output of the current supply, a drain coupled to the first source of operating potential and a source coupled to the input of the current mirror circuit. A first level-shifting circuit is coupled between the first output of the current mirror circuit and the gate of the first transistor for providing the first and second non-inverted components of the differential output signal, while a second level-shifting circuit is coupled between the second output of the current mirror circuit and the gate of the second transistor for providing the first and second inverted components of the differential output signal.

One advantage of the present invention is the technique of generating twice the magnitude of the single-ended signal driving the output stage transistor via an intermediate amplifier stage without increasing the gain or output impedance of the intermediate amplifier stage. The larger signal increases the bandwidth of the amplifier while allowing the output stage transistor to be made smaller thereby reducing its gate capacitance which stabilizes the minor loop.

BRIEF DESCRIPTION OF THE DRAWING

FIG. 1 is a schematic and block diagram illustrating a conventional operational amplifier;

FIG. 2 is a schematic and block diagram illustrating a conventional fully differential operational amplifier;

DETAILED DESCRIPTION OF THE PREFERRED EMBODIMENT

Figure 3:
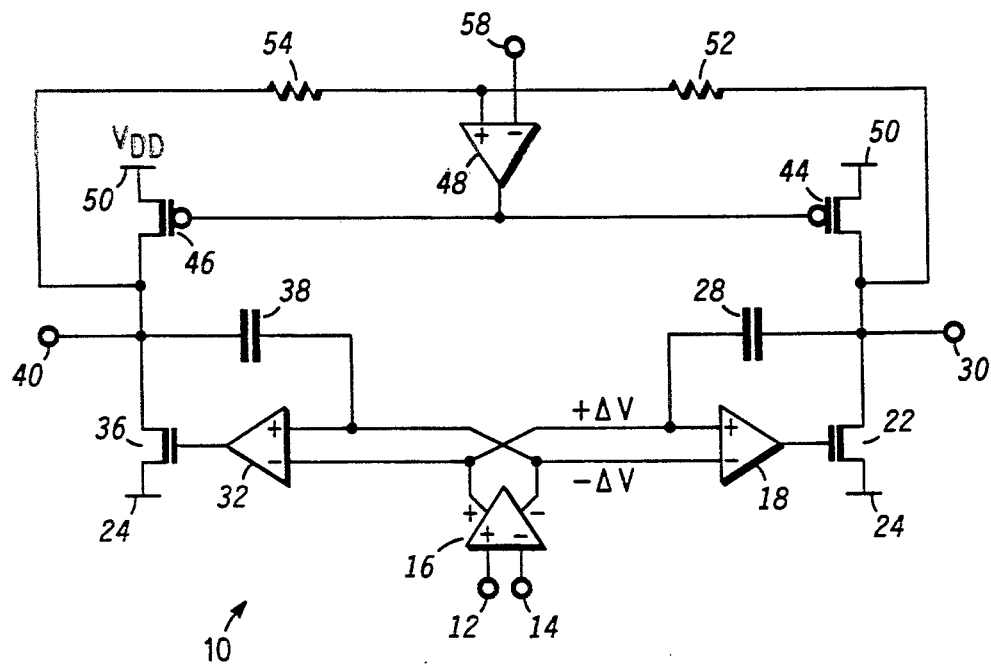
FIG. 3 is a schematic and block diagram illustrating a fully differential operational amplifier of the present invention.

Referring to FIG. 3, there is shown fully differential operational amplifier (op amp) 10 suitable for manufacturing as an integrated circuit using conventional integrated circuit processes. A differential input signal is applied at terminals 12 and 14 of fully differential amplifier 16 The non-inverting and inverting outputs of amplifier 16 are respectively coupled to the non-inverting and inverting inputs of amplifier 18, while the single-ended output of amplifier 18 drives the gate of transistor 22. Transistor 22 also includes a drain coupled through capacitor 28 to the non-inverting input of amplifier 18 and a source coupled to power supply conductor 24 operating at ground potential. The inverting output of fully differential op amp 10 is provided at terminal 30 at the drain of transistor 22. The non-inverting and inverting outputs of amplifier 16 are also respectively coupled to the inverting and non-inverting inputs of amplifier 32, while the single-ended output of amplifier 32 is coupled to the gate of transistor 36 which includes a drain coupled through capacitor 38 to the non-inverting input of amplifier 32 and a source coupled to power supply conductor 24. The non-inverting output of fully differential op amp 10 is provided at terminal 40 at the drain of transistor 36. Transistors 44 and 46 operate as current sources for transistors 22 and 36, respectively, under control of amplifier 48. The sources of transistors 44 and 46 are coupled to power supply conductor 50 operating at a positive potential such as $V_{DD}$. The potentials developed at terminals 30 and 40 are applied through feedback resistors 52 and 54 to the non-inverting input of amplifier 48 while the inverting input of the same is coupled for receiving a reference potential at terminal 58.

The embodiment of FIG. 3 provides a simplified view of the operation of the present invention to aid in an overall understanding thereof. A more detailed description is provided in FIGS. 4 and 5. It is desirable for fully differential operation of op amp 10 to maintain the average of the potentials at terminals 30 and 40 constant. For example, when the potential at terminal 30 rises in response to the differential input signal applied at terminals 12 and 14, the potential at terminal 40 falls by the same amount to maintain a fixed pivot point as determined by the common mode input signal. The balanced differential output at terminals 30 and 40 is achieved by feeding back the respective potentials developed thereat through resistors 52 and 54 to the non-inverting input of amplifier 48. Resistors 52 and 54 are typically selected equal in value of say ten kilo-ohms. The average value of the voltages from terminals 30 and 40 developed at the non-inverting input of amplifier 48 is compared to a reference potential, typically analog ground, applied at terminal 58. The single-ended output of amplifier 48 controls the gates of transistors 44 and 46 for providing the appropriate current through transistors 22 and 36 to maintain balanced operation at terminals 30 and 40. Thus, the average of the potentials developed at terminals 30 and 40 with respect to power supply conductor 24 remains substantially constant.

Recall in the prior art shown in FIG. 2 each differential output of the transconductance stage was processed through separate amplifiers A1 and A2, Miller capacitors and output stage transistors Q1 and Q2. In contrast, the inverting and non-inverting outputs of amplifier 16 of FIG. 3 are cross-coupled to drive both amplifier gain stages 18 and 32 and output stages transistors 22 and 36. Amplifier 16 includes a common mode suppression circuit to maintain a balanced differential output signal also having a constant average value.

Consider opening the minor loop formed by amplifier 18, transistor 22 and capacitor 28, say between the drain of transistor 22 and capacitor 28, and applying a voltage $+\Delta V$ thereto such that the same $+\Delta V$ voltage appears at the non-inverting input of amplifier 18. Since amplifier 16 has one output over-driven by $+\Delta V$, its common mode suppression circuit compensates by producing a voltage $-\Delta V$ at the inverting input of amplifier 18. The fully differential operation of op amp 10 requires an identical and opposite voltage $-\Delta V$ simultaneously at the non-inverting input of amplifier 32 given a voltage $+\Delta V$ at the non-inverting input of amplifier 18 to maintain the balanced operation. The voltages $+\Delta V$ and $-\Delta V$ at the non-inverting and inverting inputs of amplifier 18, respectively, produce a $2\Delta V$ ($+\Delta V - \Delta V$) differential voltage which is amplified by the gain thereof and applied at the gate of transistor 22. The same $2\Delta V$ differential voltage is applied at the non-inverting and inverting inputs of amplifier 32 and multiplied by its gain for application to the gate of transistor 36.

Thus, the cross-coupling of the differential outputs of amplifier 16 produce twice the differential signal across amplifiers 18 and 32, effectively doubling the signals at the gates of transistors 22 and 36 without increasing the amplification factors of amplifiers 18 and 32. This effectively represents doubling the open loop bandwidth of the minor loop without increasing the output impedance of amplifiers 18 and 32. Thus, the bandwidth of the minor loop increases by a factor of two, while the non-dominant pole at the output of amplifier 18 remains unchanged.

With such an advantage, it is possible to reduce the size of transistors 22 and 36 by $\sqrt{2}$ and still achieve the same magnitude of output drive at terminals 30 and 40. The smaller dimensions for transistors 22 and 36 also reduce their transconductances and gate capacitances by $\sqrt{2}$ which shifts the non-dominant pole of the minor loop $\sqrt{2}$ higher in frequency. The bandwidth of the minor loop thus decreases by the same $\sqrt{2}$. Yet, the $2\times$ increase in bandwidth from the $2\Delta V$ differential voltage offsets the smaller minor loop bandwidth resulting in a net increase in bandwidth of $\sqrt{2}$ for op amp 10.

Figure 4:
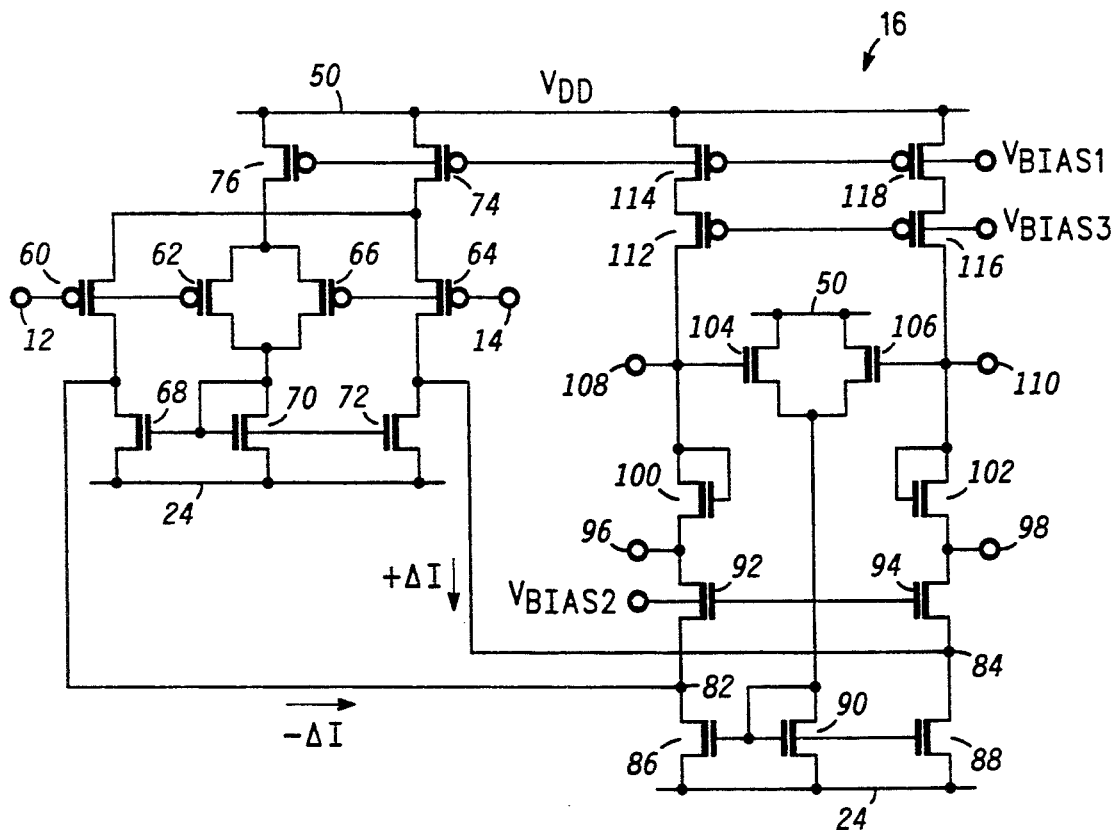
FIG. 4 is a schematic diagram illustrating the input transconductance stage of FIG. 3.

A more detailed embodiment of amplifier 16 is provided in FIG. 4 including transistors 60 and 62 having gates coupled to terminal 12 and transistors 64 and 66 having gates coupled to terminal 14 for receiving the differential input signal. The drain of transistor 60 is coupled through transistor 68 to power supply conductor 24, while the drains of transistors 62 and 66 are coupled together through transistor 70 to power supply conductor 24, and the drain of transistor 64 is coupled through transistor 72 also to power supply conductor 24. Transistors 68-72 form a current mirror with an input at the drain of transistor 70 and first and second outputs at the drains of transistors 68 and 72. The sources of transistors 60 and 64 are coupled together through transistor 74 to power supply conductor 50, and the sources of transistors 62 and 66 are coupled together through transistor 76 to power supply conductor 50. The gates of transistors 74 and 76 are coupled for receiving bias potential $V_{BIAS1}$ for providing Current sources to transistors 60, 64 and transistors 62, 66, respectively. The operation of the differential input stage formed of transistors 60-76 is thoroughly described in U.S. patent application 07/577,232 entitled "Differential Input Stage Having Improved Common Mode Rejection" by the same inventor and is hereby incorporated by reference. Briefly, the differential signal developed at the drains of transistors 60 and 64 and applied at nodes 82 and 84 at the drains of transistors 86 and 88, respectively, is compensated for variation in common mode input signal to keep the average output signal constant.

Transistors 86, 88 and 90 operate as a current mirror wherein the current flowing through transistor 90 is mirrored through transistors 86 and 88. The gates of transistors 86, 88 and 90 are coupled together, and the sources of transistors 86-90 are coupled to power supply conductor 24. Nodes 82 and 84 are coupled to the sources of transistors 92 and 94, while the gates of transistors 92 and 94 are coupled for receiving bias potential $V_{BIAS2}$. The drains of transistors 92 and 94 at nodes 96 and 98 are coupled through diode-configured transistors 100 and 102 to the gates of transistors 104 and 106 at nodes 108 and 110, respectively. The sources of transistors 104 and 106 are coupled together to the drain and gate of transistor 90 at the input of current mirror circuit 86-90, and the drains of transistors 104 and 106 are coupled to power supply conductor 50. Cascode transistor 112 and 114 are coupled between power supply conductor 50 and node 108, and cascode transistors 116 and 118 are coupled between power supply conductor 50 and node 110 for providing current sources thereto. The gates of transistors 114 and 118 are coupled for receiving bias potential $V_{BIAS1}$, and the gates of transistors 112 and 116 are coupled for receiving bias potential $V_{BIAS3}$.

Consider first a common mode signal applied at nodes 82 and 84. Cascode current source transistors 112-114 provide a first current which develops a nominal potential at node 108, while cascode current source transistors 116-118 provide a second current developing a nominal potential at node 110. Transistors 104 and 106 are responsive to the potentials at nodes 108 and 110 for sinking current through transistor 90 which determines the current flowing in transistors 86 and 88 by nature of the current mirror arrangement. With a common mode signal at nodes 82 and 84, transistors 86 and 88 conduct the appropriate current to maintain nodes 108 and 110 at equal levels. More specifically, the potentials at nodes 108 and 110 are nominally $2V_{GS}$ since transistor 90 provides $1V_{GS}$ and transistors 104 and 106 each provide $1V_{GS}$, where $V_{GS}$ is the transistor gate-source voltage while operating. Diode-configured transistors 100 and 102 level-shift the potentials at nodes 108 and 110 down one more $V_{GS}$, thereby developing $1V_{GS}$ nominally at nodes 96 and 98.

A differential input signal $+\Delta V$ applied at terminals 12 and 14 induces small currents $\pm \Delta I$, in the nanoamp range, to flow into nodes 82 and 84. The small currents $\pm \Delta I$ flow up through transistors 92 and 100 and transistors 94 and 102 because of the high impedance at the drains of current mirror transistors 86 and 88. Transistors 92 and 94 provide gain creating a high impedance at nodes 96 and 98 such that small currents $\pm \Delta I$ induce changes $\pm \Delta V$ at nodes 96, 98, 108 and 110. The currents $\pm \Delta I$ have negligible effect on level-shifting transistors 100 and 102, hence, the voltages at nodes 96 and 108 move together maintaining $1V_{GS}$ separation. The same $1V_{GS}$ separation is true for the voltages at nodes 98 and 110. For example, if current $-\Delta I$ flows into node 82 and through transistors 92 and 100, the voltages at nodes 96 and 108 increase by $+\Delta V$. The current $+\Delta I$ flowing into node 84 and through transistors 94 and 102 changes the voltages at nodes 98 and 110 by $-\Delta V$. Thus, the net potential difference between nodes 108 and 98 is $2\Delta V$, and the net potential difference between nodes 110 and 96 is also $2\Delta V$. The property of generating twice the differential signal $2\Delta V$ at nodes 108 and 98 and nodes 110 and 96 is an important feature of amplifier 16.

Figure 5:
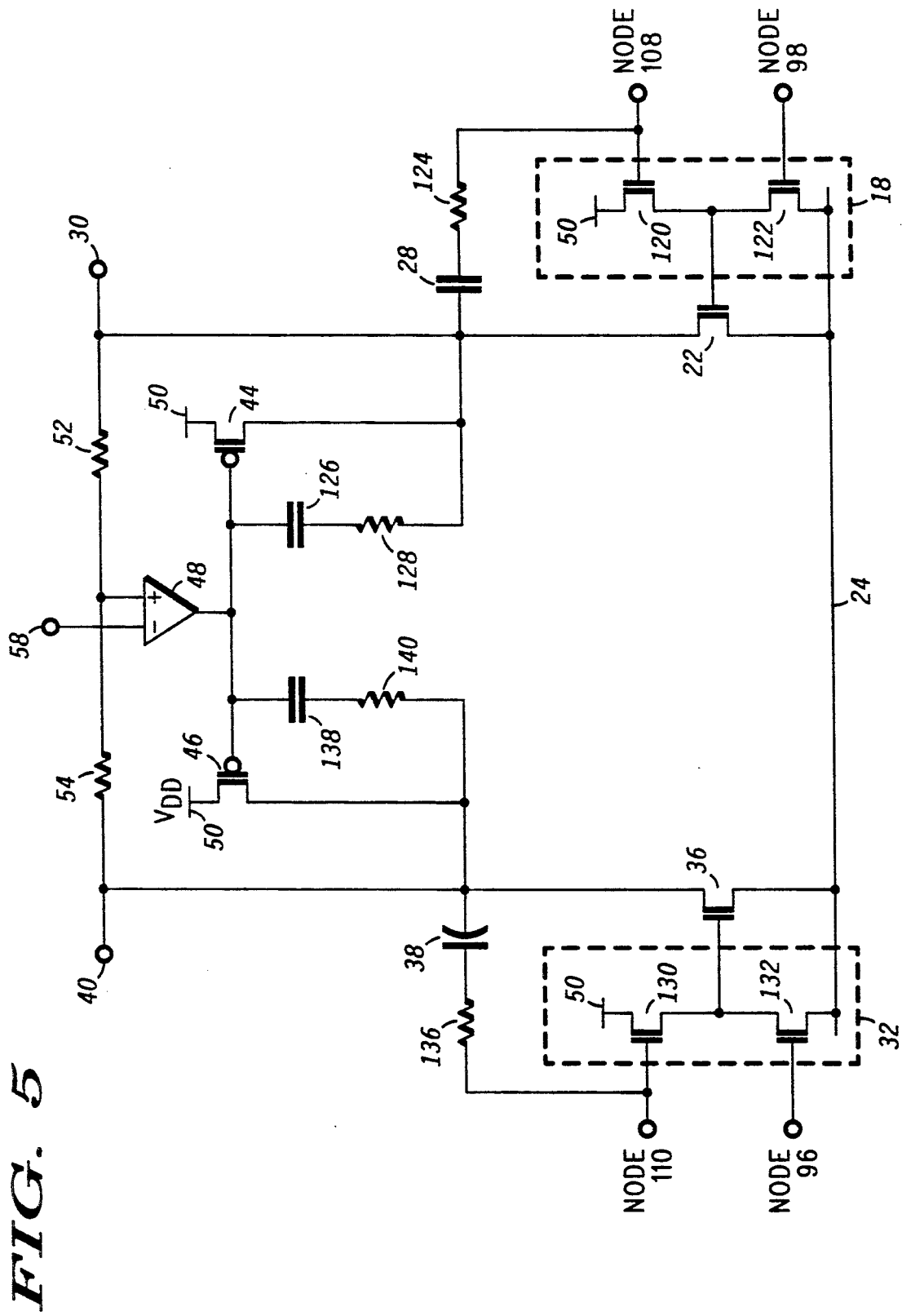
FIG. 5 is a schematic diagram illustrating intermediate gain stages and the output stage of the operational amplifier of FIG. 3.

Turning to FIG. 5, there is shown further detail of amplifiers 18 and 32, wherein amplifier 18 includes transistor 120 having a gate coupled to node 108, a drain coupled to power supply conductor 50 and a source coupled to the drain of transistor 122. Components having a similar function are assigned the same reference number used in FIGS. 3 and 4. The gate of transistor 122 is coupled to node 98 while its source is coupled to power supply conductor 24. The common drains of transistors 120 and 122 form the output of amplifier 18 at the gate of transistor 22. The feedback path between terminal 30 and node 108 includes serially coupled capacitor 28 and resistor 124 for compensation. The drain of transistor 44 is coupled to terminal 30 as shown in FIG. 3 although capacitor 126 and resister 128 are now serially coupled between the source and gate of transistor 44 also for providing compensation. Amplifier 32 also includes stacked transistors 130 and 132 having gates coupled to node 110 and node 96, respectively, with the drain of transistor 130 coupled to power supply conductor 50 and the source of transistor 132 coupled to power supply conductor 24. The output of amplifier 18 is provided at the interconnection of the source of transistor 130 and the drain transistor 132 at the gate of transistor 36. The feedback path between terminal 30 and node 104 includes serially coupled capacitor 38 and resistor 136, while transistor 46 includes serially coupled capacitor 138 and resistor 140 between its drain and gate for compensation.

The combination of nodes 108 and 96 provides the same function as the non-inverting output of amplifier 16 of FIG. 3, and the combination of nodes 110 and 98 provides the same function as the inverting output of amplifier 16. The potentials at nodes 108 and 110 are nominally equal although respond in opposite directions to the differential input signal applied at terminals 12 and 14. Likewise, the potentials at nodes 96 and 98 are nominally equal although respond in opposite directions to the differential input signal. Transistor 120 is a source-follower with gain of one while transistor 122 has gain of minus one. The gate of transistor 22 thus receives an output signal of amplifier 18 as $(1) \times (\Delta V) + (-1) \times (-\Delta V) = 2\Delta V$. Transistors 120 and 122 in combination with the level-shifting transconductance stage (transistors 86–118 of FIG. 4) provide twice the output signal without increasing the gain and output impedance of amplifier 18. Likewise, transistors 130 and 132 provide gains of one and minus one, respectively, whereby the gate of transistor 36 receives the output signal of amplifier 32 as $(1) \times (\Delta V) + (-1) \times (-\Delta V) = 2\Delta V$.

The present invention allows the size of transistors 22 and 36 to be cut by $\sqrt{2}$ and still maintain the same drive level at terminals 30 and 40. The non-dominant pole at the output of amplifiers 18 and 32 is shifted higher in frequency due to the decrease in gate capacitance of transistors 22 and 36. Thus, doubling the drive level to the output stage transistors 22 and 36, without increasing the gain or output impedance of amplifiers 18 and 32, increases the bandwidth and operating speed of the minor loop, while reducing the size of transistors 22 and 36 decreases their gate capacitance for improved stability of the minor loop.

Hence, what has been provided is a novel operational amplifier with increased operation speed without introducing stability problems.

I claim:

1. An amplifier circuit responsive to a differential input signal for providing first and second differentially related output signals, comprising:
   a differential amplifier responsive to the differential input signal for providing a differential output signal with common mode rejection having first and second inverted components and first and second non-inverted components;
   a first amplifier having inverting and non-inverting inputs and an output, said non-inverting input being coupled for receiving said first non-inverted component of said differential output signal, said inverting input being coupled for receiving said second inverted component of said differential output signal, said first amplifier including,
   (a) a first transistor having a gate, a drain and a source, said gate being coupled for receiving said first non-inverted component of said differential output signal, said drain being coupled to a first power supply conductor, and
   (b) a second transistor having a gate, a drain and a source, said gate being coupled for receiving said second inverted component of said differential output signal said drain being coupled to said source of said first transistor, said source being coupled to a second power supply conductor; and
   a second amplifier having inverting and non-inverting inputs and an output, said non-inverting input being coupled for receiving said first inverted component of said differential output signal, said inverting input being coupled for receiving said second non-inverted component of said differential output signal, said outputs of said first and second amplifiers providing the first and second differentially related output signals of the amplifier circuit.

2. The amplifier circuit of claim 1 wherein said second amplifier includes:
   a third transistor having a gate, a drain and a source, said gate being coupled for receiving said first inverted component of said differential output signal, said drain being coupled to said first power supply conductor; and
   a fourth transistor having a gate, a drain and a source, said gate being coupled for receiving said second non-inverted component of said differential output signal, said drain being coupled to said source of said third transistor, said source being coupled to said second power supply conductor.

3. The amplifier circuit of claim 2 further including:
   first current supply means having first and second outputs for providing first and second currents;
   a fifth transistor having a gate, a source and a drain for providing output drive, said gate being coupled to said output of said first amplifier, said drain being coupled to said first output of said first current supply means, said source being coupled to said second power supply conductor;
   a sixth transistor having a gate, a source and a drain for providing output drive, said gate being coupled to said output of said second amplifier, said drain being coupled to said second output of said first current supply means, said source being coupled to said second power supply conductor, said drains of said fifth and sixth transistors providing the first and second differentially related output signals;
   a first capacitor coupled between said drain of said fifth transistor and said gate of said first transistor; and
   a second capacitor coupled between said drain of said sixth transistor and said gate of said third transistor.

4. The amplifier circuit of claim 3 wherein said differential amplifier includes:
   a differential input stage responsive to said differential input signal for providing differentially related output signals with common mode rejection;
   second current supply means having first and second outputs for providing third and fourth currents;
   a seventh transistor having a gate, a source and a drain, said gate being coupled to said said first output of said second current supply means, said drain being coupled to said first power supply conductor;
   an eighth transistor having a gate, a source and a drain, said gate being coupled to said second output of said second current supply means, said drain being coupled to said first power supply conductor;
   a ninth transistor having a gate, a source and a drain, said gate and drain being coupled together to said gate of said seventh transistor for providing said first non-inverted component of said differential output signal;
   a tenth transistor having a gate, a source and a drain, said gate being coupled for receiving a first bias potential, said drain being coupled to said source of said ninth transistor for providing said second non-inverted component of said differential output signal;
   an eleventh transistor having a gate, a source and a drain, said gate and drain being coupled together to said gate of said eighth transistor for providing said first inverted component of said differential output signal;
   a twelfth transistor having a gate, a source and a drain, said gate being coupled for receiving said first bias potential, said drain being coupled to said source of said eleventh transistor for providing said second inverted component of said differential output signal, said sources of said tenth and twelfth transistors coupled for receiving said differentially related output signals of said differential input stage; and a current mirror circuit having an input and first and second outputs, said input being coupled to said sources of said seventh and eighth transistors, said first output being coupled to said source of said tenth transistor, said second output being coupled to said source of said twelfth transistor.

5. The amplifier circuit of claim 4 wherein said first current supply means includes:

a thirteenth transistor having a gate, a source and a drain, said drain being coupled to said drain of said fifth transistor, said source being coupled to said first power supply conductor;

a fourteenth transistor having a gate, a source and a drain, said drain being coupled to said drain of said sixth transistor, said source being coupled to said first power supply conductor;

a third amplifier having non-inverting and inverting inputs and an output, said inverting input being coupled to a second bias potential, said output being coupled to said gates of said thirteenth and fourteenth transistors;

a first resistor coupled between said drain of said thirteenth transistor and said non-inverting input of said third amplifier; and a second resistor coupled between said drain of said fourteenth transistor and said non-inverting input of said third amplifier.

6. In an amplifier circuit a transconductance stage provides first and second differentially related signals having a predetermined DC offset to an output driver stage for providing a first output signal, comprising:

a first transistor having a gate, a drain and a source, said gate being coupled for receiving the first differentially related signal, said drain being coupled to a first source of operating potential;

a second transistor having a gate, a drain and a source, said gate being coupled for receiving the second differentially related signal, said drain being coupled to said source of said first transistor, said source being coupled to a second source of operating potential;

a third transistor having a gate, a drain and a source, said gate being coupled to said drain of said second transistor, said drain providing the first output signal of the amplifier circuit, said source being coupled to said second source of operating potential; and means for providing third and fourth differentially related signals to the output driver stage for producing a second output signal of the amplifier circuit.

7. The output driver stage of claim 6 further including:

a fourth transistor having a gate, a drain and a source, said gate being coupled for receiving the third differentially related signal, said drain being coupled to said first source of operating potential;

a fifth transistor having a gate, a drain and a source, said gate being coupled for receiving the fourth differentially related signal, said drain being coupled to said source of said fourth transistor, said source being coupled to said second source of operating potential; and a sixth transistor having a gate, a drain and a source, said gate being coupled to said drain of said fifth transistor, said drain providing said second output signal of the amplifier circuit, said source being coupled to said second source of operating potential.

8. The output driver stage of claim 7 further including:

current supply means having a control input for receiving a control signal and having first and second outputs respectively coupled to said drains of said third and sixth transistors for providing first and second currents thereto;

a first capacitor coupled between said drain of said third transistor and said gate of said first transistor; and a second capacitor coupled between said drain of said sixth transistor and said gate of said fourth transistor.

9. The output driver stage of claim 8 further including:

an amplifier having first and second inputs and an output, said first input being coupled for receiving a reference potential, said output providing said control signal for said current supply means;

a first resistor coupled between said second input of said amplifier and said drain of said third transistor; and a second resistor coupled between said second input of said amplifier and said drain of said sixth transistor.

10. In an amplifier circuit a transconductance stage responsive to a differential input signal for providing first and second non-inverted components of a differential output signal and first and second inverted components of the differential output signal to an output stage, the transconductance stage comprising:

a current mirror circuit having an input and first and second outputs, the differential input signal being applied at said first and second outputs of said current mirror circuit;

current supply means having first and second outputs for providing first and second currents of predetermined magnitude;

a first transistor having a gate, a drain and a source, said gate being coupled to said first output of said current supply means, said drain being coupled to a first source of operating potential, said source being coupled to said input of said current mirror circuit;

a second transistor having a gate, a drain and a source, said gate being coupled to said second output of said current supply means, said drain being coupled to said first source of operating potential, said source being coupled to said input of said current mirror circuit;

first level-shifting means coupled between said first output of said current mirror circuit and said gate of said first transistor for providing the first and second non-inverted components of the differential output signal; and second level-shifting means coupled between said second output of said current mirror circuit and said gate of said second transistor for providing the first and second inverted components of the differential output signal.

11. The transconductance stage of claim 10 wherein said first level-shifting means includes a third transistor having a gate, a drain and a source, said gate and drain being coupled together to said gate of said first transistor, said source being coupled to said first output of said current mirror circuit.

12. The transconductance stage of claim 11 wherein said second level-shifting means includes a fourth transistor having a gate, a drain and a source, said gate and drain being coupled together to said gate of said second transistor, said source being coupled to said second output of said current mirror circuit.

13. The transconductance stage of claim 11 wherein said current mirror circuit includes:
- a fifth transistor having gate, a drain and a source, said gate and drain being coupled together to said sources of said first and second transistors, said source being coupled to a second source of operating potential;
- a sixth transistor having a gate, a drain and a source, said drain being coupled to said first output of said current mirror circuit, said source being coupled to said second source of operating potential, said gate being coupled to said gate of said fifth transistor; and
- a seventh transistor having a gate, a drain and a source, said drain being coupled to said second output of said current mirror circuit, said source being coupled to said second source of operating potential, said gate being coupled to said gate of said fifth transistor.

14. The transconductance stage of claim 13 further including:
- an eighth transistor having a gate, a drain and a source, said drain being coupled to said source of said third transistor, said source being coupled to said drain of said sixth transistor, said gate being coupled for receiving a first bias potential; and
- a ninth transistor having a gate, a drain and a source, said drain being coupled to said source of said fourth transistor, said source being coupled to said drain of said seventh transistor, said gate being coupled for receiving said first bias potential.

15. The transconductance stage of claim 14 wherein said current supply means includes:
- a tenth transistor having a gate, a drain and a source, said drain being coupled to said first source of operating potential, said gate being coupled for receiving a second bias potential;
- an eleventh transistor having a gate, a drain and a source, said drain being coupled to said first source of operating potential, said gate being coupled for receiving said second bias potential;
- a twelfth transistor having a gate, a drain and a source, said drain being coupled to said source of said tenth transistor, said gate being coupled for receiving a third bias potential, said source being coupled to said gate of said first transistor; and
- a thirteenth transistor having a gate, a drain and a source, said drain being coupled to said source of said eleventh transistor, said gate being coupled for receiving said third bias potential, said source being coupled to said gate of said second transistor.

16. A method of increasing the bandwidth of an amplifier circuit, comprising the steps of:
- applying a differential input signal to a first differential amplifier for providing inverted and non-inverted output signals of the amplifier circuit at first and second outputs;
- splitting said inverted output signal of said first differential amplifier into first and second inverted components having a predetermined DC offset;
- splitting said non-inverted output signal of said first differential amplifier into first and second non-inverted components having said predetermined DC offset;
- combining said first inverted component with said second non-inverted component for providing a non-inverted output signal of the amplifier circuit having twice the magnitude as said non-inverted output signal of said first differential amplifier; and
- combining said first non-inverted component with said second inverted component for providing a inverted output signal of the amplifier circuit having twice the magnitude as said inverted output signal of said first differential amplifier; and
- feeding back said non-inverted output signal and said inverted output signal of the amplifier circuit through a second differential amplifier for controlling bases of first and second transistors, said first and second transistors having drains coupled to a first power supply conductor and having sources coupled to said first and second outputs of the amplifier circuit respectively for maintaining balanced operation for said non-inverted output signal and said inverted output signal.

* * * * *